(12) United States Patent
Takahashi

(10) Patent No.: US 6,462,572 B2
(45) Date of Patent: Oct. 8, 2002

(54) SOCKET USED FOR SEMICONDUCTOR DEVICE AND TESTING SYSTEM CONNECTED TO SOCKET THROUGH DUAL-TRANSMISSION LINES

(75) Inventor: Hiroki Takahashi, Tokyo (JP)

(73) Assignee: NEC Corporation (JP)

( * ) Notice: Subject to any disclaimer, the term of this patent is extended or adjusted under 35 U.S.C. 154(b) by 13 days.

(21) Appl. No.: 09/815,550

(22) Filed: Mar. 22, 2001

(65) Prior Publication Data

US 2001/0025957 A1 Oct. 4, 2001

(30) Foreign Application Priority Data

Mar. 20, 2000 (JP) ........................................ 2000-093115

(51) Int. Cl.[7] .............................................. G01R 31/02
(52) U.S. Cl. ......................................... 324/755; 439/71
(58) Field of Search ............................... 324/158.1, 755, 324/754, 758, 763; 439/71, 70, 66; 438/17, 18, 19, 128

(56) References Cited

U.S. PATENT DOCUMENTS 6,062,873 A * 5/2000 Kato ............................ 439/71
6,292,003 B1 * 9/2001 Fredrickson et al. ........ 324/755
6,184,698 B1 * 2/2002 Yoshida et al. .............. 324/755
6,229,124 B1 * 5/2002 Trucco ........................ 438/128

* cited by examiner

Primary Examiner—Michael Sherry
Assistant Examiner—Timmy Nguyen
(74) Attorney, Agent, or Firm—Dickstein, Shapiro, Morin & Oshinsky, LLP.

(57) ABSTRACT

A testing system is used for diagnosing a semiconductor device, and includes a testing apparatus for supplying an input test signal and receiving an output signal, a socket having plural pairs of contact leaves for nipping solder balls of the semiconductor device therein and a wiring board connected between the testing apparatus and the plural pairs of contact leaves, wherein the contact leaves of each pair are electrically isolated from each other so that a transmission line for the input test signal is only short circuited with a transmission line for the output signal at associated one of the solder balls, thereby permitting the solder balls to serve as neutral points in the dual transmission lines.

18 Claims, 9 Drawing Sheets

_US 6,462,572 B2_

SOCKET USED FOR SEMICONDUCTOR DEVICE AND TESTING SYSTEM CONNECTED TO SOCKET THROUGH DUAL-TRANSMISSION LINES

FIELD OF THE INVENTION

This invention relates to a socket used for a semiconductor device and a testing apparatus equipped with the socket and, more particularly, to a socket appropriate to a ball-grid-array package for a semiconductor device and a testing apparatus equipped with the socket connected to a testing circuit through dual-transmission lines.

DESCRIPTION OF THE RELATED ART

FIG. 1 illustrates a typical example of the testing system used for semiconductor devices, and the equivalent circuit thereof is shown in FIG. 2. The prior art testing system largely comprises a testing apparatus 20, a socket and a printed wiring board 45. The printed wiring board 45 is provided between the testing apparatus 20 and the socket 40, and a semiconductor device 50 is connected to the socket 40.

The testing apparatus 20 includes a coaxial cable containing a plurality of signal lines 30 and a testing circuit 31. The testing circuit includes a plurality of drivers D1, D2 ... and Dn and a plurality of receivers R1, R2, ... and Rn.

The signal lines 30 are broken down into two groups. The drivers D1, D2, ... and Dn are respectively connected to the signal lines 30 of the first group which in turn are connected to conductive lines on the printed wiring board 45. The other conductive lines on the printed wiring board 45 are connected to the signal lines 30 of the second group, and the signal lines 30 of the second group in turn are connected to the receivers R1, R2, ... and Rn. The drivers D1, D2, ... and Dn are respectively paired with the receivers R1, R2, ... and Rn, and, accordingly, the signal lines 30 of the first group are respectively paired with the signal lines 30 of the second group. The signal lines 30 of the first group and the signal lines 30 of the second group are hereinbelow referred to as "signal line pairs", and the signal line pairs are also labeled with reference numeral 30.

A pair of conductive lines 46 on the printed board 45 is connected to one of the signal line pairs 30. The socket 40 has a housing 47 and plural contacts 48. The housing 47 is formed of insulating material. A large recess is formed in the housing 47, and is open to the top surface of the housing 47. The large recess is narrowed in the housing 47, and the semiconductor device 50 is received in the large recess. Plural small recesses are further formed in the housing 47, and are open to the bottom surface of the housing 47. The large recess is connected through pairs of slits to the small recesses.

The contacts 48 are identical in structure with one another, and each of the contacts 48 has a boss portion and a pair of contact leaves A1/B1, A2/B2, ... An/Bn. The plural contacts 48 are snugly received in the small recesses, respectively, and the pairs of contact leaves A1/B1, A2/B2, ... and An/Bn project into the large recess. The pairs of conductive lines 46 are respectively associated with the plural contacts 48. One of the conductive lines of each pair 46 is connected to the contact leaf A1, A2, ... or An of associated one of the contact 48, and the other of the conductive lines of the pair 46 is connected to the other contact leaf B1, B2, ... or Bn of the same contact 48. Thus, the plural drivers D1, D2, ... and Dn are electrically connected through the signal lines 30 of the first group 30 and the associated conductive lines 46 to the plural contact leaves A1, A2, ... and An, and the drivers D1, D2, ... and Dn, the signal lines 30 of the first group, the associated conductive lines 46 and the contact leaves A1, A2, ... and form transmission lines for a driver system. On the other hand, the other contact leaves B1, B2, ... and Bn are connected through the other conductive lines and the signal lines 30 of the second group 30 to the receivers R1, R2, ... and Rn, respectively, and the contact leaves B1, B2, ... and Bn, the other conductive lines 46, the signal lines 30 of the second group and the receivers R1, R2, ... and Rn form transmission lines for a receiver system. The transmission lines for the driver system are electrically connected to the transmission lines for the receiver system through the boss portions encircled in ellipses in FIG. 1 as well as the solder balls 51, and form plural dual transmission lines DTL1, DTL2, ... and DTLn.

The semiconductor device includes a semiconductor chip (not shown) sealed in a package and ball grid array 51 formed on the bottom surface of the package. The ball grid array 51 has a plurality of solder balls, which are also labeled with reference numeral 51. The solder balls 51 are laid on a grid pattern on the bottom surface of the package. The semiconductor chip is electrically connected to the solder balls 51 of the ball grip array 51, and is communicable with the testing system through the ball grip array 51.

The solder balls 51 are equal in number to the contacts 48, and the contacts 48 are arranged in the pattern same as the ball grip array 51. When the semiconductor device 50 is received in the socket 40, the solder balls 51 are respectively aligned with the pairs of contact leaves A1/B1. The semiconductor device 50 is pressed against the socket 40. Then, the solder balls 51 expand the associated pairs of contact leaves A1/B1, and are inserted into the gaps formed in the pairs of contact leaves A1/B1, respectively.

One of the dual transmission lines DTL1, DTL2, ... and DTLn is shown in FIG. 2. The dual transmission line shown in FIG. 2 stands for any one of the dual transmission lines DTL1, DTL2, ... and DTLn, and is labeled with "DTL". The driver and the receiver in the dual transmission line DTL are respectively labeled with "D" and "R". The transmission line for the driver system is short circuited with the transmission line for the receiver system at the boss portion of the associated contact 48, and the boss portion serves as a neutral point 32 of the dual transmission line DTL. Reference "LS" is representative of the inductance of the socket 40, and reference "Ci" stands for the input impedance of the semiconductor device 50.

When the drivers D1, D2, ... and Dn output input signals SIN1, SIN2, ... and SINn, respectively, the signal lines 30 of the first group, the associated conductive lines 46 and the contact leaves A1, A2, ... and An propagate the input signals SIN1, SIN2, ... and SINn to the solder balls 51, respectively. Reference "SIN" stands for the input signal SIN1, SIN2, ... or SINn propagated through the dual transmission line DTL. The input signals SIN1, SIN2, and SINn are taken into the semiconductor chip of the semiconductor device 50. Since the transmission lines for the driver system are respectively connected to the transmission lines for the receiver system at the neutral points 32, the input signals SIN1, SIN2 ... and SINn enter the transmission lines for the receiver system, and the conductive lines 46 and the signal lines 30 of the second group propagate the input signals SIN1 to the receivers R1, R2 ... and Rn, respectively, and the input signals SIN1, SIN2 ... and SINn are sunk into a terminating circuit (not shown).

When the semiconductor chip of the semiconductor device 50 outputs output signals SOUT1, SOUT2 ... and SOUTn to the solder balls 51 the contact leaves B1, B2, . . . and Bn, the associated conductive lines 46 and the signal lines 30 of the second group propagate the output signals SOUT1, SOUT2, and SOUTn to the receivers R1, R2 . . . and Rn, respectively. Reference "SOUT" also stands for the output signals SOUT1, SOUT2 . . . and SOUTn in FIG. 2. However, the output signals enters the transmission lines for the driver system through the neutral points 32, and the conductive lines 46 and the signal lines 30 of the second group propagate the output signals SOUT1, SOUT2 . . . and SOUTn to the drivers D1, D2 . . . and Dn, respectively. The output signals SOUT1, SOUT2 . . . and SOUTn are sunk into the terminating circuit.

The ball- grid- array package is less connectable to the prior art testing system rather than the TSOP package, and a standard connector tends to fail to catch the solder balls 51. The socket with the contact leaves A1/B1, A2/B2, . . . and An/Bn is better than the standard connector, and is used for testing a semiconductor integrated circuit sealed in the ball-grip- array package. However, a problem is encountered in the prior art testing system in that the waveform of a high-frequency signal equal to or greater than 800 megabit/second is deformed due to the inductance LS of the socket 40. This means that the high-frequency signal does not reach the semiconductor integrated circuit at a target time. For this reason, the prior art testing system can not accurately diagnose the semiconductor device in so far as the semiconductor integrated circuit is connected to the prior art testing apparatus 20 through the prior art socket 40.

SUMMARY OF THE INVENTION

It is therefore an important object of the present invention to provide a socket, which transfers a high- frequency signal of the order of hundreds mega-bits per second between a semiconductor device and a testing apparatus without deformation of the waveform.

It is also an important object of the present invention to provide a testing system which is equipped with the socket.

To accomplish the object, the present invention proposes to make each terminal of a semiconductor device serve as a neutral point of a dual transmission line.

In accordance with one aspect of the present invention, there is provided a socket for connecting at least one dual transmission line to a terminal of a semiconductor device comprising a case, an input contact piece supported by the case, connected between the at least one dual transmission line and the terminal for supplying an input signal to the terminal and having a first parasitic inductance coupled thereto, and an output contact piece supported by the case in such a manner as to be electrically isolated from the input contact piece, having a second parasitic inductance coupled thereto and equal in value to the first parasitic inductance and connected between the at least one dual transmission line and the terminal for transferring an output signal from the terminal to the at least one dual transmission line.

In accordance with another aspect of the present invention, there is provided a testing system for a semiconductor device equipped with at least one terminal comprising a testing apparatus including a first signal path and a second signal path, a socket including a case for receiving the semiconductor device, an input contact piece supported by the case, connected to the at least one terminal and having a first parasitic inductance coupled thereto and an output contact piece supported by the case in such a manner as to be electrically isolated from the input contact piece, having a second parasitic inductance coupled thereto and equal in value to the first parasitic inductance and connected to the terminal and a wiring board including at least two signal lines connected between the first signal path and the terminal for transferring an input signal from the first signal path to the input contact piece and between the second signal path and the terminal for transferring an output signal from the output contact piece to the second signal path, respectively, the first signal path, the input contact piece and one of the at least two signal lines connected therebetween form a first transmission line for the input signal, and the second signal path, the output contact piece and the other of the at least two signal lines connected therebetween form a second transmission line, which in turn forms a dual transmission line together with the first transmission line.

BRIEF DESCRIPTION OF THE DRAWINGS

The features and advantages of the socket and the testing system will be more clearly understood from the following description taken in conjunction with the accompanying drawings in which.

DESCRIPTION OF THE PREFERRED EMBODIMENTS

Figure 1:
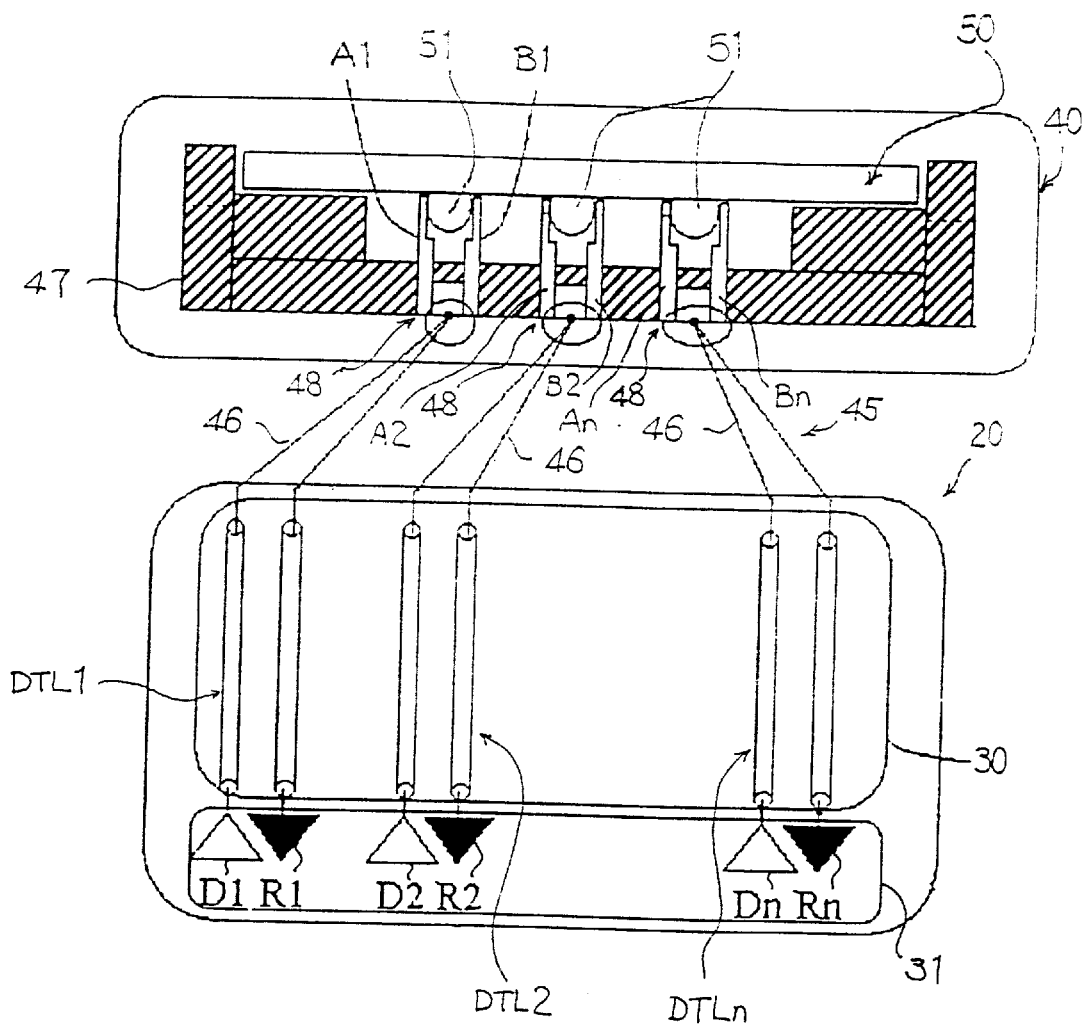
FIG. 1 is a schematic view showing the prior art testing system connected to the semiconductor device.
Figure 2:
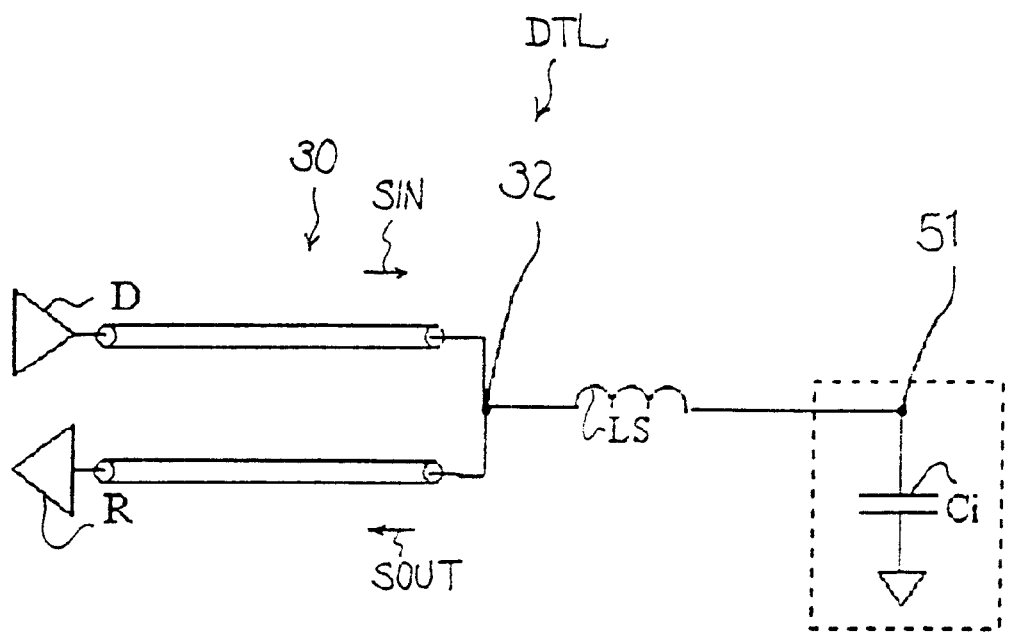
FIG. 2 is a circuit diagram showing the equivalent circuit of the prior art dual transmission line.

In order to make the terminal of a semiconductor device serve as the neutral point of a dual transmission line, it is necessary to make the inductance coupled to one of the contact leaves of a contact incorporated in a socket equal to that of the other contact leaf. If the values of the characteristic impedance compensating capacitance coupled to the contact leaves of the dual transmission line are equal to each other, the terminal also serves as the neutral point of the dual transmission line. The dual transmission line is assumed to consist of a transmission line for a driver system and a transmission line for a receiver system. When the transmission line for the driver system is short-circuited with the transmission line for the associated receiver system at the terminal of a semiconductor device, the dual transmission line has the neutral point at the terminal. A socket according to the present invention has the following features.
1. The socket includes plural contacts. Each of the plural contacts has an input contact leaf and an output contact leaf for nipping a terminal of a semiconductor device, i.e., a pin or solder ball of the semiconductor device therebetween. The values of the inductance LS coupled to the contact leaves are equal to each other so that the pin or the solder ball serves as an electrical neutral point of a dual transmission line containing the contact leaves.
2. The input contact leaf is driven by a driver incorporated in a testing apparatus, and the driver supplies an input signal through the input contact leaf to the semiconductor device. On the other hand, the output contact leaf supplies an output signal from the semiconductor device to a receiver, which is also incorporated into the testing apparatus.
3. The inductance LS coupled to each contact leaf, the characteristic impedance Zc of the dual transmission line and the input capacitance Ci of the semiconductor device satisfy the following equation.

$$LS = (½) \times (Ci \times Zc^2)$$

4. Characteristic impedance compensating capacitors are provided for all the contact leaves, and the values of the inductance coupled to all the contact leaves are made equal to one another. Then, the characteristic impedance compensating capacitors have values CC of capacitance equal to one another. The capacitance CC of the characteristic impedance compensating capacitor, the characteristic impedance Zc of the dual transmission line and the input capacitance Ci of the semiconductor device satisfy the following equation.

$$CC = (½) \times [(2LS/Zc^2) - Ci]$$

5. A wiring board is provided on the back surface of the socket, and is electrically connected to the socket and the testing apparatus used for testing the semiconductor device.
6. The characteristic impedance compensating capacitor includes a signal line and a ground line serving as the capacitor electrodes. Thus, the characteristic impedance compensating capacitor is build in the wiring board.
7. The socket is used for a semiconductor device testing system of the type having the dual transmission lines.
The testing system has the following features.
8. The testing system includes a socket, a characteristic impedance compensating capacitor, a testing circuit and a wiring board. The socket has plural contacts, and each of the contacts nips a pin or a solder ball of a semiconductor device to be tested. The contact has two contact leaves, which is held in contact with the pin or the solder ball at all times. One of the two contact leaves is connected to a driver of the testing circuit, and the other of the contact leaves is connected to a receiver of the testing circuit. Plural dual transmission lines are respectively connected to the contacts, and the characteristic impedance compensating capacitor is provided for the dual transmission line. The semiconductor device is diagnosed with the testing circuit. The wiring board is electrically connected between the testing apparatus and the socket. The testing system is featured by making the values CC of capacitance of all the characteristic impedance compensating capacitors equal to one another. This feature is resulted from the values LS of inductance coupled to all the contact leaves equal to one another. The capacitance CC of the characteristic impedance compensating capacitor, the characteristic impedance Zc of the dual transmission line and the input capacitance Ci of the semiconductor device satisfy the following equation.

$$CC = (½) \times [(2LS/Zc^2) - Ci]$$

Then, the pin or the solder ball serves as the electric neutral point of the dual transmission line.
9. The characteristic impedance compensating capacitor is built in the wiring board, and a signal line and a ground line both incorporated in the wiring board are used as the capacitor electrodes.
10. The receiver of the testing circuit is simply replaced with a terminating circuit.

First Embodiment

Figure 3:
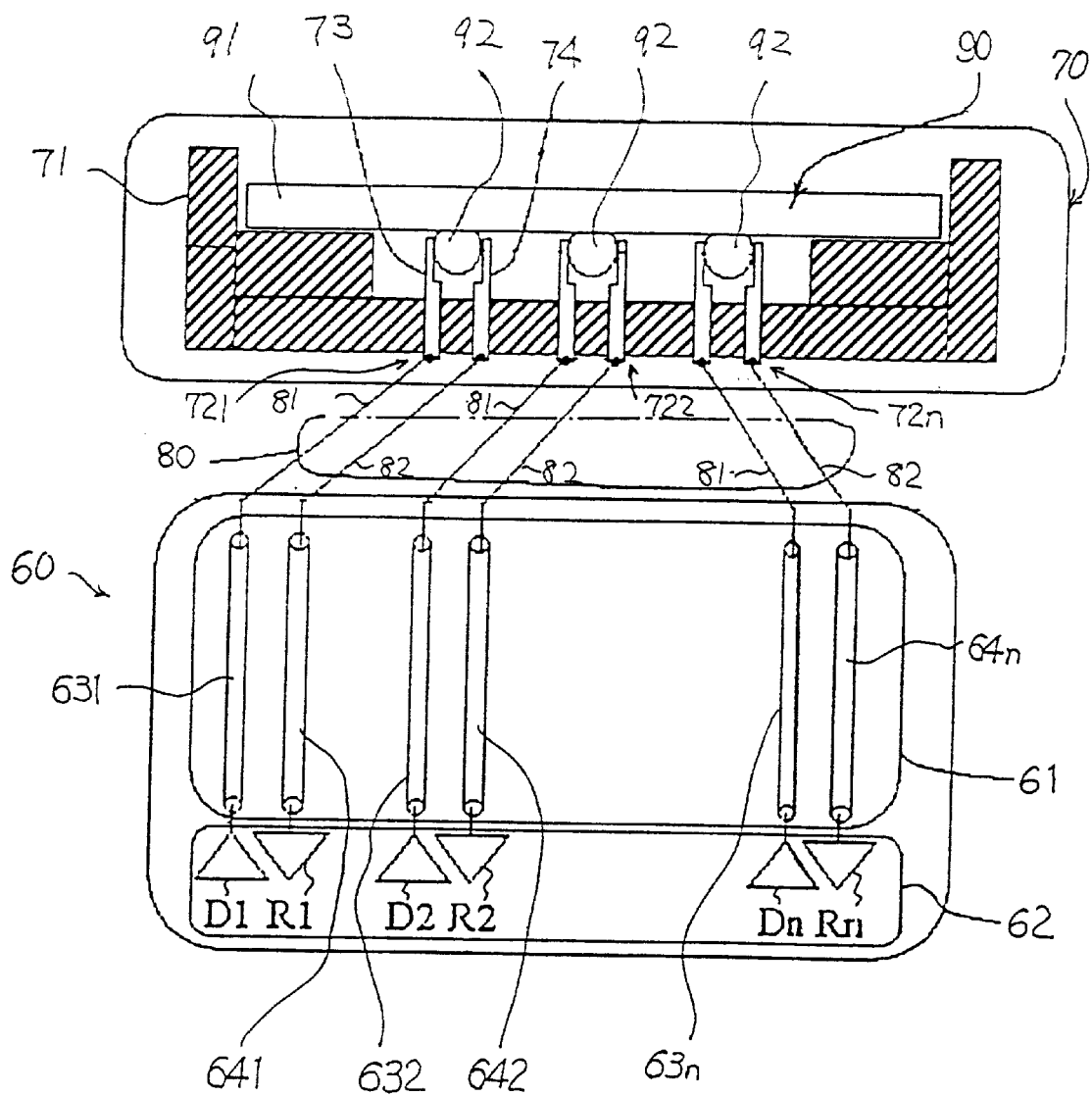
FIG. 3 is a schematic view showing a testing system connected to a semiconductor device according to the present invention.
Figure 4:
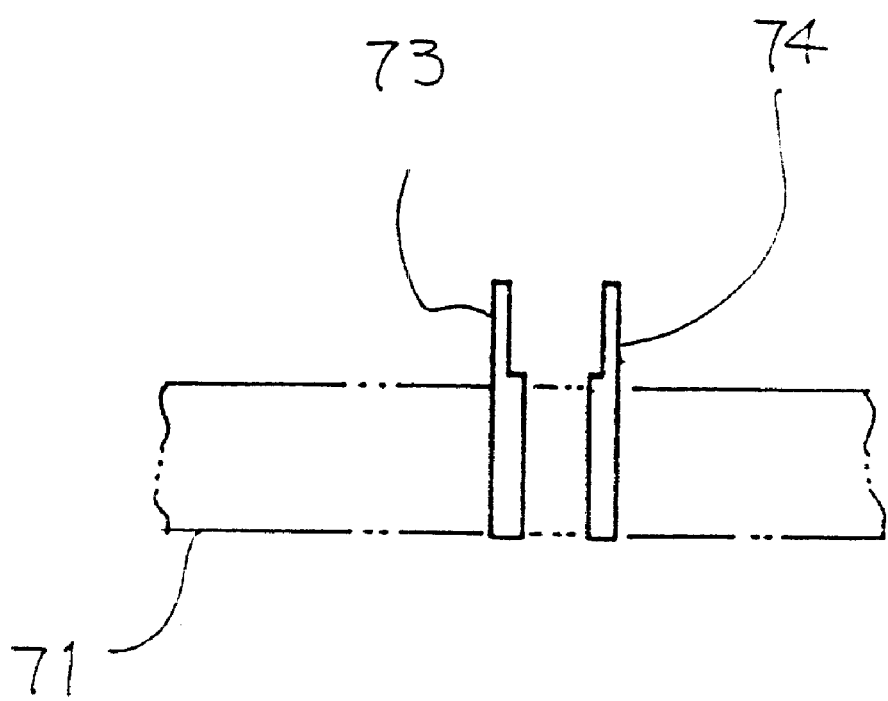
FIG. 4 is a front view showing a pair of conductive leaves incorporated in a socket according to the present invention.

Referring to FIGS. 3 and 4 of the drawings, a testing apparatus embodying the present invention largely comprises a testing apparatus 60, a socket 70 and a printed wiring board 80, and a semiconductor device 90 is to be subjected to a test. The testing apparatus 60 is connected through the printed wiring board 80 to the socket 70. The semiconductor device 90 is received in the socket 70, and the printed wiring board 80 and the socket 70 propagate input signals and output signals between the testing apparatus 60 and the semiconductor device 90. The testing apparatus 60 analyzes the output signals so as to diagnose the semiconductor device 90.

The testing apparatus 60 includes a coaxial cable 61 and a testing circuit 62. The coaxial cable 61 contains plural signal lines 631, 632, . . . and 63n and 641, 642, . . . and 64n. The signal lines 631, 632, . . . and 63n are adapted to propagate the input signals SIN1, SIN2, . . . and SINn from the testing circuit 62 to the printed wiring board 80, and the output signals SOUT1, SOUT2, . . . and SOUTn are propagated through the signal lines 641, 642, . . . and 64n from the printed wiring board 80 to the testing circuit 62. The testing circuit 62 includes plural drivers D1, D2, . . . and Dn and plural receivers aR1, R2, and Rn. The drivers D1, D2, . . . and Dn produce the input signals SIN1, SIN2, . . . and SINn, and drive the signal lines 631, 632, . . . and 63n with the input signals SIN1, SIN2, . . . and SINn, respectively. On the other hand, the output signals SOUT1, SOUT2, . . . and SOUTn are produced in the semiconductor device 90, and are propagated through the socket 70, the printed wiring board 80 and the signal lines 641, 642, . . . and 64n to the receivers R1, R2, . . . and 64n, respectively. The second characters of references D1- to Dn, i.e., 1, 2, . . . and n indicate that the input signals SIN1, SIN2, . . . and SINn are output from the drivers D1, D2, . . . and Dn, respectively. Similarly, the second characters of references R1- to Rn, i.e., 1, 2, . . . and n indicate that the output signals SONT1, SOUT2, . . . and SOUTn are received by the receivers R1, R2, . . . and Rn, respectively. References "SIN" and "SOUT" respectively stand for any one of the input signals SIN1, SIN2, . . . and SINn and any one of the output signals SOUT1, SOUT2, . . . and SOUTn in FIG. 5 of the drawings.

The printed wiring board 80 includes conductive lines 81 and 82, and the conductive lines 81 and 82 are patterned on an insulating board. The conductive lines 81 are connected to the signal lines 631, 632, . . . and 63n, respectively, and the conductive lines 82 are respectively connected to the signal lines 641, 642, . . . and 64n.

The socket 70 includes a housing 71 and plural contacts 721, 722, . . . and 72n. The housing 71 is formed of insulating material, and is formed with a recess and pairs of slits. A relatively narrow recess is overlapped with a relatively wide recess. Thus, the recess is stepwise widened. A package 91, a semiconductor chip (not shown) sealed in the package 91 and solder balls 92 form in combination the semiconductor device 90. The solder balls 92 are arranged in grid array, and the semiconductor chip is electrically connected to the solder balls 92. The recess is adapted to receive the semiconductor device 90. The package 91 is placed on the step between the wide recess and the narrow recess, and the solder balls 92 project from the package 91 into the narrow recess.

The pairs of slits are open to the relatively narrow recess, and are further open to the back surface o f the housing 71. The plural contacts 721, 722, . and 72n are identical in structure with one another, and each contact 721, 722, . . . or 72n consists of contact leaves 73 and 74. The contacts 721, 722, . . . and 72n are respectively assigned to the pairs of slits, and are inserted thereinto, respectively. The plural contacts 721, 722, . . . and 72n are laid on the grip pattern of the solder balls 92. The contact leaves 73 and 74 are spaced from each other, and are electrically isolated by the housing 71 (see FIG. 4). Thus, the contact leaves 73 and 74 of each contact 721, 722, . . . or 72n are electrically opened.

The gap between the contact leaves 73 and 74 is narrower than the diameter of the solder balls 92. The contact leaves 73 and 74 are elastically deformable, and, accordingly, the gap therebetween is variable. When the semiconductor device 90 is inserted into the housing 71, the solder balls 92 are respectively aligned with the plural contacts 721, 722, . and 72n. The package 91 is pressed against the step of the housing 91. Then, the contact leaves 73 and 74 are deformed, and the gaps therebetween are widened. The solder balls 92 are inserted into the gaps between the contact leaves 73 and 74, and are pinched therebetween.

The pairs of conductive lines 81/82 are connected to the plural contacts 721, 722, . . . and 72n, respectively. The conductive lines 81 are respectively connected to the contact leaves 73, and the other conductive lines 82 are connected to the other contact leaves 74, respectively. For this reason, the drivers D1, D2, . . . and Dn, the associated signal lines 631, 632, . . . and 63n, the associated conductive lines 81 and the associated contact leaves 73 form transmission lines for the driver system. Accordingly, the input signals SIN1, SIN2, . . . and SINn are propagated from the drivers D1, D2, . . . and Dn through the associated signal lines 631, 632, . . . and 63n and the associated conductive lines 81 to the associated contact leaves 73 without any short-circuit with the adjacent transmission lines. Similarly, the receivers R1, R2, . . . and Rn, the associated signal lines 631, 632, . . . and 63n, the associated conductive lines 81 and the associated contact leaves 74 form transmission lines for the receiver system. Accordingly, the output signals SOUT1, SOUT2, . . . and SOUTn are propagated from the contact leaves 74, through the associated conductive lines 82 and the associated signal lines 641, 642, . . . and 64n to the associated receivers R1, R2, . . . and Rn without any short-circuit with the adjacent transmission lines. However, when the semiconductor device 90 is connected to the socket 70, the contact leaves 73 are electrically connected through the solder balls 92 to the associated contact leaves 74, respectively. For this reason, the transmission lines for the driver system and the associated transmission lines for the receiver system form in combination dual transmission lines, respectively, and each dual transmission line DTL is equivalent to a circuit configuration shown in FIG. 5. Though not shown, the dual transmission lines DTL are appropriately terminated. The neutral point NP of the dual transmission line DTL is located at the associated solder ball 92, and the input capacitance Ci is coupled to the solder ball 92.

Figure 5:
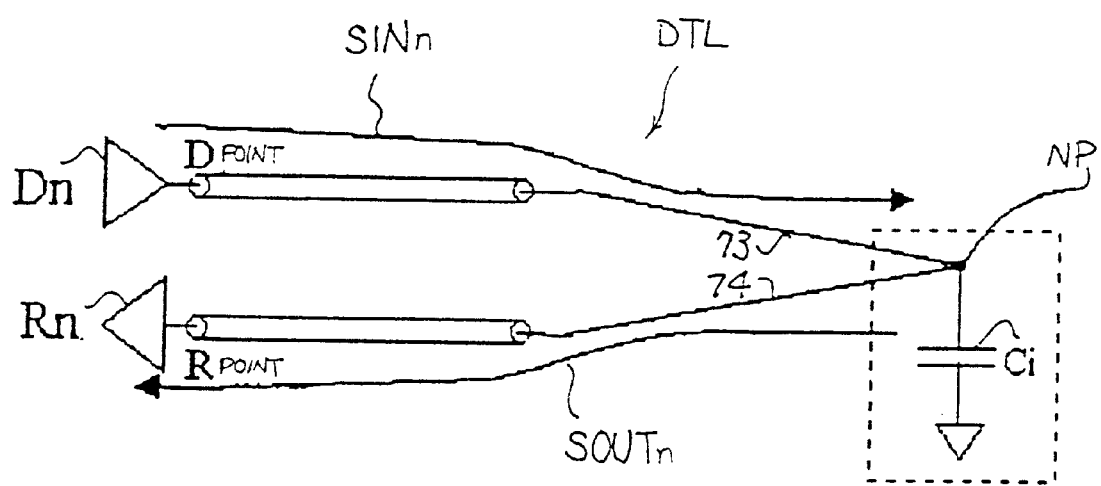
FIG. 5 is a circuit diagram showing an equivalent circuit of a dual transmission line formed in the testing system according to the present invention.

As shown in FIG. 5, the driver Dn generates the input signal SINn. The input signal SINn is propagated through the transmission line for the driver system, and reaches the semiconductor device 90. Concurrently, the input signal SINn enters the transmission line for the receiver system, and reaches the receiver Rn. The input signal SINn is absorbed by the terminating circuit. Similarly, the output signal SOUTn is output from the semiconductor device 90. The output signal SOUTn is propagated through the transmission line for the receiver system, and reaches the receiver Rn. Concurrently, the output signal SOUTn enters the transmission line for the driver system, and reaches the driver Dn. The output signal SOUTn is absorbed into the terminating circuit.

Second Embodiment

Figure 6:
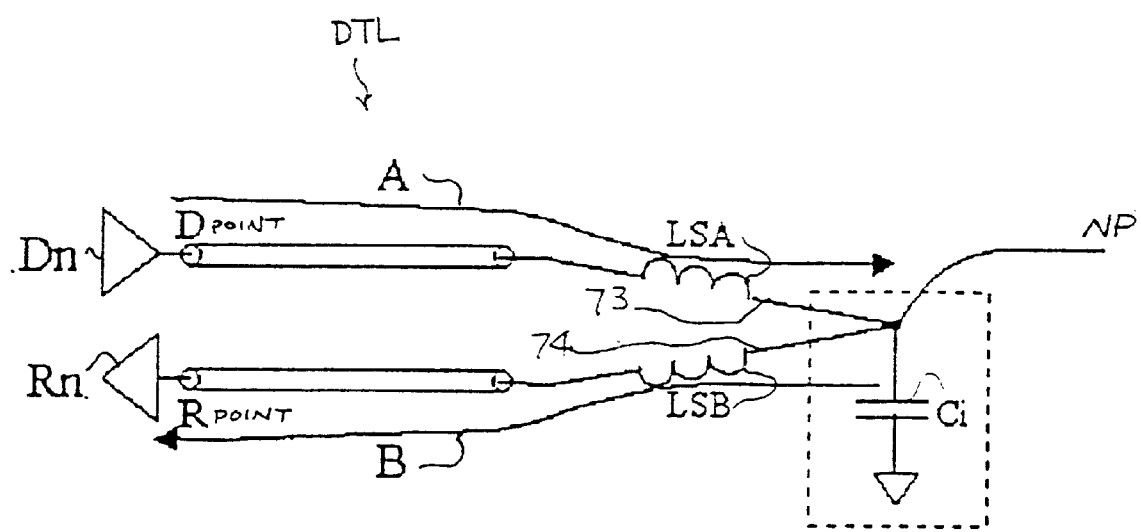
FIG. 6 is a circuit diagram showing an equivalent circuit of a dual transmission line incorporated in another testing system according to the present invention.

FIG. 6 shows an equivalent circuit of a dual transmission line DTL incorporated in another testing system embodying the present invention. Although other dual transmission lines are connected to other solder balls, they are omitted from FIG. 6 for the sake of simplicity. The dual transmission line DTL is similar to the dual transmission line DTL of the first embodiment except that the impedance mismatching is eliminated from the dual transmission line by appropriately regulating the inductance LSA of the contact leaf 73 and the inductance LSB of the other contact leaf 74. For this reason, the components of the dual transmission line DTL is labeled with the references designating the corresponding components of the first embodiment.

A transmission line A for a driver system is short circuited with a transmission line B for a receiver system at the associated solder ball, and the transmission line A for the driver system and the transmission line B for the receiver system form in combination the dual transmission line DTL. The characteristic impedance Zc of the transmission line A or B is expressed by the following equation.

$$Zc = (L/C)^{1/2}$$

The relation among the characteristic impedance Zc, the input capacitance Ci of the semiconductor device 90, the inductance LSA of the contact leaf 73 and the inductance LSB of the other contact leaf 74 is expressed as $$(LSA+LSB) = CiZc^2$$

The contact leaf 73 is shaped as similar to the other contact leaf 74. Then, the inductance LS coupled to each contact leaf 73/74 is given as $$LS = (\tfrac{1}{2}) \times (CiZc^2)$$

The contact leaves 73 and 74 are designed to satisfy the above equation, and the impedance mismatching is eliminated from the dual transmission line DTL.

Third Embodiment

Figure 7A:
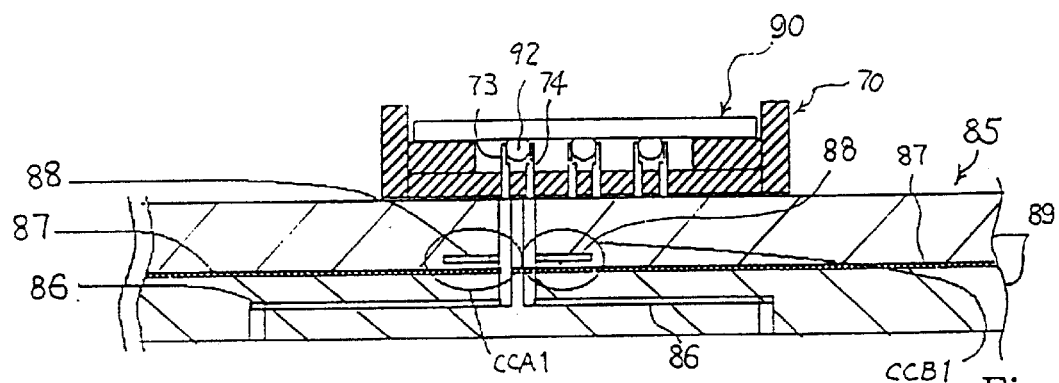
FIG. 7A is a cross sectional view showing the structure of a wiring board incorporated in yet another testing system according to the present invention.
Figure 7B:
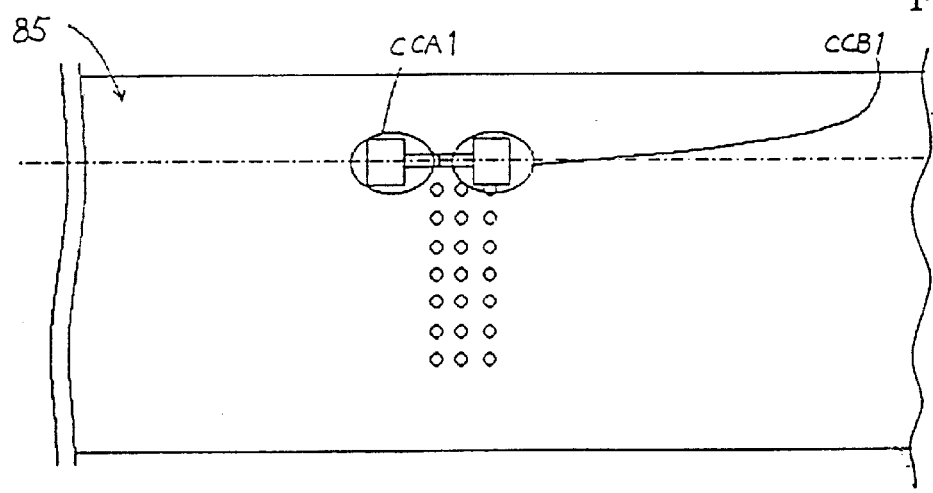
FIG. 7B is a plane view showing the inner layout of the wiring board.

FIGS. 7A and 7B show a wiring board 85 incorporated in yet another testing apparatus embodying the present invention. The other components of the testing system arc similar to those of the first embodiment, and no further description is incorporated hereinbelow.

The wiring board 85 includes the contact leaves 73 and 74, signal lines 86 connected between the contact leaves 73 and 74 and the connectors, ground lines 87 and signal lines 88 connected to the signal lines 86. The signal lines 86 and 88 and the ground lines 87 are formed in an insulating board 89, and the insulating board 89 provides appropriate electrical isolation. Though not shown in FIG. 7A, the connectors are coupled to the coaxial cable of the testing apparatus.

Figure 8:
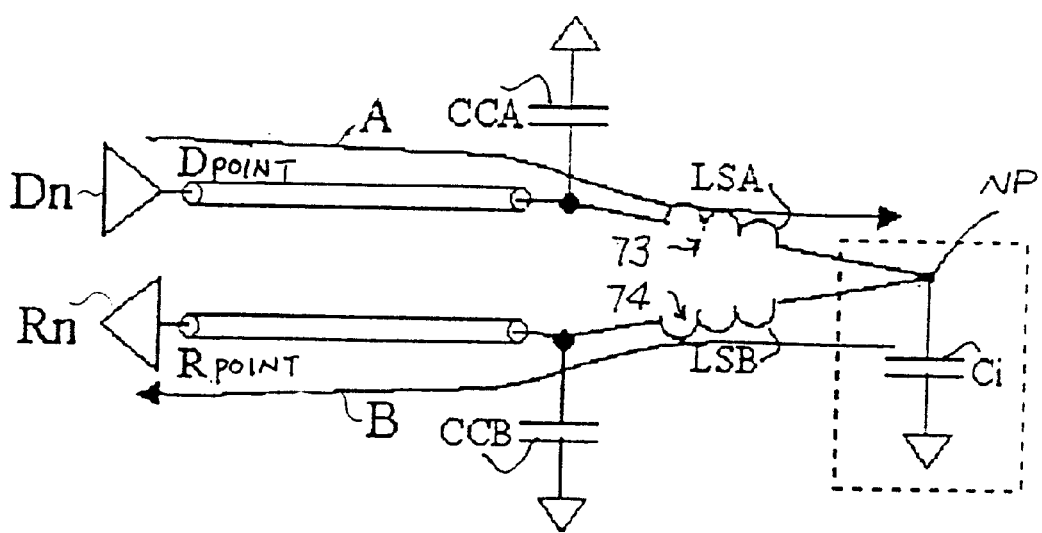
FIG. 8 is a circuit diagram showing an equivalent circuit of a dual transmission line incorporated in the testing system.

Although the signal lines 86 and 87 and the ground lines 87 are connected to only one pair of contact leaves 73/74 in FIG. 7A, plural sets of signal/ground lines 86, 87 and 88 are connected to the other pairs of contact leaves 73 and 74, respectively. The signal lines 88 project from the associated signal lines 86, and extend in parallel to the major surfaces of the insulating board 89. The ground lines 86 also extend in parallel to the major surfaces of the insulating board 89, and are overlapped with the signal lines 88, respectively. The insulating material of the board 89 intervenes between the ground lines 86 and the signal lines 88 so as to form characteristic impedance compensating capacitors CCA1 and CCB1. The characteristic impedance compensating capacitor CCA1 is coupled to the contact leaf 73, and the characteristic impedance compensating capacitor CCB1 is coupled to the other contact leaf 74. Thus, the characteristic impedance compensating capacitors CCA and CCB are coupled to the transmission line A for the driver system and the transmission line B for the receiver system, respectively, as shown in FIG. 8.

When the testing apparatus 60 diagnoses the semiconductor device 90 with high-frequency input signals of the order of hundreds mega-bits per second, impedance mismatching tends to take place due to the input capacitance Ci of the semiconductor device 90, the parasitic inductance LSA of the contact leaf 73 and the parasitic inductance LSB of the contact leaf 74. The impedance mismatching is causative of the deformation of the high-frequency input signals, and the high-frequency input signals reach the integrated circuit of the semiconductor device 90 at timing different from target timing. The compensating capacitors CCA and CCB are expected to eliminate the impedance mismatching from the dual transmission line.

As described in conjunction with the second embodiment, the contact leaf 73 is designed to be identical in shape with the contact leaf 74, and the parasitic inductance LSA is equal to the parasitic inductance LSB. Accordingly, the compensating capacitor CCA1 is equal in capacitance to the compensating capacitor CCB1, and the capacitance CC of each compensating capacitor CCA1/CCB1 is given as $$CC = (\tfrac{1}{2}) \times [(2LS)/Zc^2] - Ci]$$

where LS is the inductance LSA/LSB coupled to each contact leaf 73/74. Thus, even though the semiconductor device 90 is operative under the high-frequency signals, the testing system implementing the third embodiment precisely diagnoses the semiconductor device.

Fourth Embodiment

Figure 9:
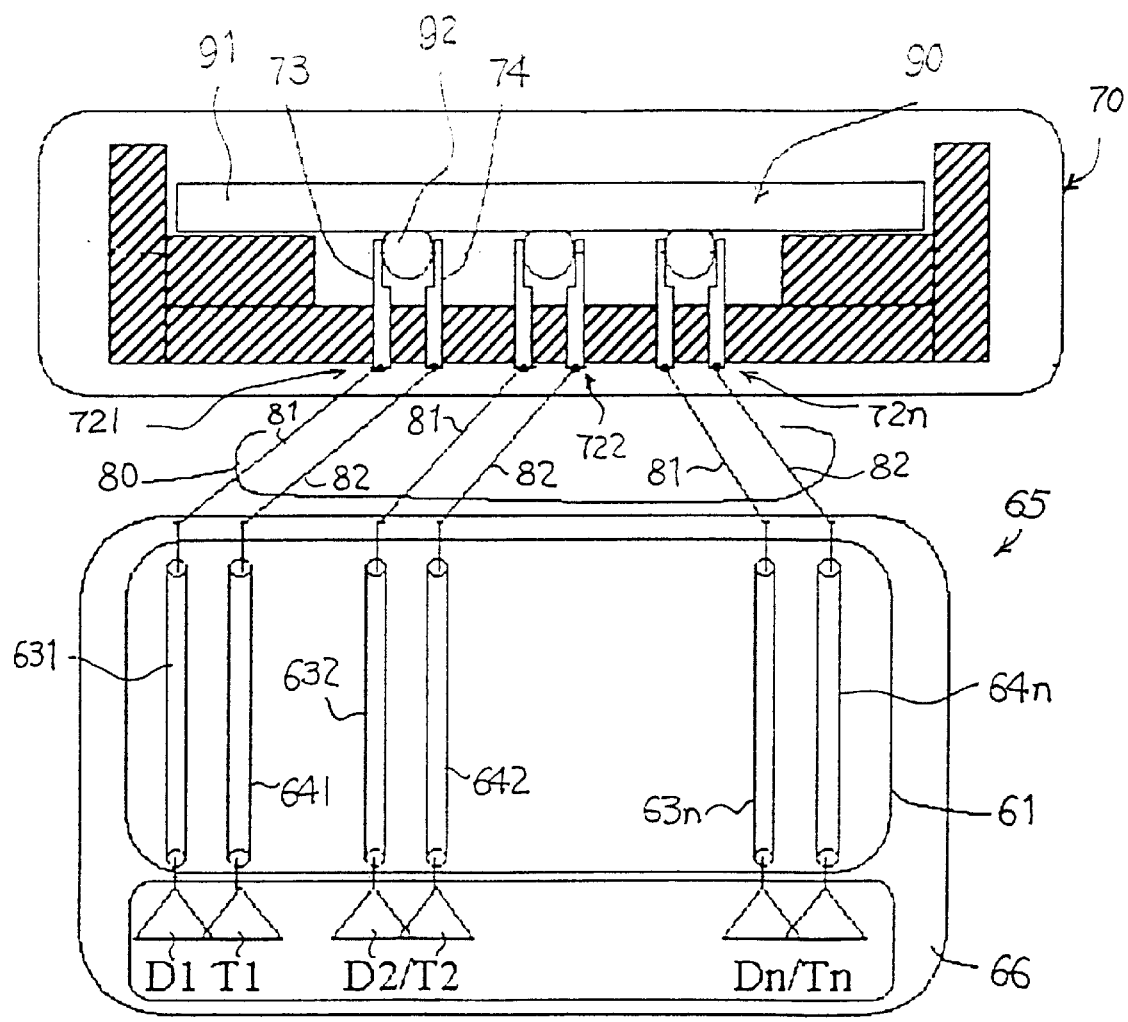
FIG. 9 is a schematic view showing still another testing system according to the present invention.

FIG. 9 shows still another testing system embodying the present invention. The testing system implementing the fourth embodiment is similar to the testing system of the first embodiment except a testing apparatus 65. For this reason, the other components are labeled with the references designating corresponding components of the first embodiment without detailed description.

The testing apparatus includes a coaxial cable 61 and a testing circuit 66. The coaxial cable 61 is identical with that of the first embodiment. The testing circuit 66 includes drivers D1, D2, . . . and Dn and terminating circuits T1, T2, . . . and Tn. Thus, the receivers R1, R2, . . . and Rn are replaced with the terminating circuits T1, T2 . . . and Tn, respectively. Even though the signal lines 641, 642, . . . and 64n are connected to the terminating circuits T1, T2, . . . and Tn, the contact leaves 73 and 74 electrically isolated from each other causes the associated solder balls 92 to serve as neutral points NT in the dual transmission lines as similar to those of the first embodiment.

As will be appreciated from the foregoing description, the contacts 721, 722, . . . and 72n permit the terminals of the semiconductor device, i.e., the pins or the solder balls 92 to be nipped between the contact leaves 73 and 74 to be the neutral points NP of the dual transmission lines DTL by virtue of the electrical isolation between the contact leaves 73 and 74. This results in the following advantages. First, it is possible to accurately regulate the timing calibration for the transmission lines A containing the contact leaves 73 through the TDR method, by way of example, and the input signals reach the semiconductor device at target timing. Similarly, the timing calibration is easily achieved for the transmission lines B containing the contact leaves 74 by using the TDR method, by way of example, and the strobe accuracy is enhanced. The testing system is available for a high-frequency semiconductor device by virtue of the characteristic impedance compensating capacitors CCA/CCB.

Although particular embodiments of the present invention have been shown and described, it will be apparent to those skilled in the art that various changes and modifications may be made without departing from the spirit and scope of the present invention.

What is claimed is:

1. A socket for connecting at least one dual transmission line to a terminal of a semiconductor device, comprising:
    a case;
    an input contact piece supported by said case, connected between said at least one dual transmission line and said terminal for supplying an input signal to said terminal, and having a first parasitic inductance coupled thereto; and
    an output contact piece supported by said case in such a manner as to be electrically isolated from said input contact piece, having a second parasitic inductance coupled thereto and equal in value to said first parasitic inductance, and connected between said at least one dual transmission line and said terminal for transferring an output signal from said terminal to said at least one dual transmission line.

2. The socket as set forth in claim 1, in which said input contact piece and said output contact piece are formed by contact leaves elastically deformable for nipping said terminal therebetween and identical in shape with one another.

3. The socket as set forth in claim 1, in which said dual transmission line and said semiconductor device have a characteristic impedance and an input capacitance, and said first parasitic inductance and said second parasitic inductance satisfy the following equation $$LS = (\tfrac{1}{2}) \times (Ci \times Zc^2)$$

where LS is each of the first and second parasitic inductances, Zn is said characteristic impedance of said dual transmission line and Ci is said input capacitance of said semiconductor device.

4. The socket as set forth in claim 3, in which a first characteristic impedance compensating capacitor and a second characteristic impedance compensating capacitor are respectively coupled to said input contact piece and said output contact piece for eliminating impedance mismatching from said dual transmission line.

5. The socket as set forth in claim 4, in which said first parasitic inductance and said second parasitic inductance equal in value to said first parasitic inductance cause said first characteristic impedance compensating capacitor to be equal in capacitance to said second characteristic impedance compensating capacitor.

6. The socket as set forth in claim 5, in which the capacitance of said first and second characteristic impedance compensating capacitors is expressed as $$CC = (½) \times [(2LS/Zc^2) - Ci]$$

where CC is said the capacitance of said first and second characteristic impedance compensating capacitors.

7. The socket as set forth in claim 4, in which said first characteristic impedance compensating capacitor and said second characteristic impedance compensating capacitor are built in a wiring board connected between a testing apparatus and said socket.

8. The socket as set forth in claim 7, in which signal lines are partially overlapped with ground lines in said wiring board so as to form said first characteristic impedance compensating capacitor and said second characteristic impedance compensating capacitor.

9. The socket as set forth in claim 2, in which said terminal is a solder ball forming a part of a ball-grid array package.

10. A testing system for a semiconductor device equipped with at least one terminal, comprising:
- a testing apparatus including a first signal path and a second signal path;
- a socket including a case for receiving said semiconductor device, an input contact piece supported by said case, connected to said at least one terminal and having a first parasitic inductance coupled thereto, and an output contact piece supported by said case in such a manner as to be electrically isolated from said input contact piece, having a second parasitic inductance coupled thereto and equal in value to said first parasitic inductance and connected to said terminal; and
- a wiring board including at least two signal lines connected between said first signal path and said terminal for transferring an input signal from said first signal path to said input contact piece and between said second signal path and said terminal for transferring an output signal from said output contact piece to said second signal path, respectively,
- said first signal path, said input contact piece and one of said at least two signal lines connected therebetween forming a first transmission line for said input signal, said second signal path, said output contact piece and the other of said at least two signal lines connected therebetween forming a second transmission line, which forms a dual transmission line together with said first transmission line.

11. The testing system as set forth in claim 10, in which said input contact piece and said output contact piece are formed by contact leaves elastically deformable for nipping said terminal therebetween and identical in shape with one another.

12. The testing system as set forth in claim 10, in which said dual transmission line and said semiconductor device have a characteristic impedance and an input capacitance, and said first parasitic inductance and said second parasitic inductance satisfy the following equation $$LS = (½) \times (Ci \times Zc^2)$$

where LS is each of the first and second parasitic inductances, Zn is said characteristic impedance of said dual transmission line and Ci is said input capacitance of said semiconductor device.

13. The testing system as set forth in claim 12, in which a first characteristic impedance compensating capacitor and a second characteristic impedance compensating capacitor are respectively coupled to said input contact piece and said output contact piece for eliminating impedance mismatching from said dual transmission line.

14. The testing system as set forth in claim 13, in which said first parasitic inductance and said second parasitic inductance equal in value to said first parasitic inductance cause said first characteristic impedance compensating capacitor to be equal in capacitance to said second characteristic impedance compensating capacitor.

15. The testing system as set forth in claim 14, in which the capacitance of said first and second characteristic impedance compensating capacitors is expressed as $$CC = (½) \times [(2LS/Zc^2) - Ci]$$

where CC is said the capacitance of said first and second characteristic impedance compensating capacitors.

16. The testing system as set forth in claim 13, in which said first characteristic impedance compensating capacitor and said second characteristic impedance compensating capacitor are built in said wiring board.

17. The testing system as set forth in claim 7, in which said wiring board has ground lines and signal lines partially overlapped with said ground lines so as to form said first characteristic impedance compensating capacitor and said second characteristic impedance compensating capacitor.

18. The testing as set forth in claim 11, in which said terminal is a solder ball forming a part of a ball-grid array package of said semiconductor device.

* * * * *

UNITED STATES PATENT AND TRADEMARK OFFICE
CERTIFICATE OF CORRECTION

PATENT NO.    : 6,462,572 B2
DATED         : October 8, 2002
INVENTOR(S)   : Hiroki Takahashi It is certified that error appears in the above-identified patent and that said Letters Patent is hereby corrected as shown below:

<u>Title page,</u>
Item [30], should read:
-- [30] Foreign Application Priority Data
    March 30, 2000 (JP) …………..2000-093115 --

Signed and Sealed this

Fourth Day of March, 2003

JAMES E. ROGAN
*Director of the United States Patent and Trademark Office*